United States Patent [19]

Tihanyi

[11] Patent Number: 4,641,163
[45] Date of Patent: Feb. 3, 1987

[54] MIS-FIELD EFFECT TRANSISTOR WITH CHARGE CARRIER INJECTION

[75] Inventor: Jenö Tihanyi, Munich, Fed. Rep. of Germany

[73] Assignee: Siemens Aktiengesellschaft, Berlin and Munich, Fed. Rep. of Germany

[21] Appl. No.: 456,613

[22] Filed: Jan. 10, 1983

[30] Foreign Application Priority Data

Jan. 12, 1982 [DE] Fed. Rep. of Germany ....... 3200660

[51] Int. Cl.[4] ............................................. H01L 29/78
[52] U.S. Cl. .................................... 357/23.4; 357/38; 357/43; 357/41
[58] Field of Search ............... 357/23 VD, 38, 21, 43, 357/41

[56] References Cited

U.S. PATENT DOCUMENTS

| | | | |
|---|---|---|---|
| 4,199,774 | 4/1980 | Plummer | 357/23 VD |
| 4,364,073 | 12/1982 | Becke et al. | 357/38 |
| 4,454,527 | 6/1984 | Patalong | 357/38 |
| 4,471,372 | 9/1984 | Tihanyi | 357/43 |
| 4,485,390 | 11/1984 | Jones et al. | 357/41 |

FOREIGN PATENT DOCUMENTS

0040816 12/1981 European Pat. Off. ...... 357/23 VD

Primary Examiner—Martin H. Edlow
Attorney, Agent, or Firm—Herbert L. Lerner; Laurence A. Greenberg

[57] ABSTRACT

MIS-FET assembly, including a first MIS-FET having a semiconductor substrate of a first conductivity type with first and second surfaces, at least one channel zone of a second conductivity type opposite the first conductivity type being embedded in the first surface of the substrate, a source zone of the first conductivity type being embedded in the channel zone, a drain zone adjoining the first surface of the substrate, a drain electrode connected to the second surface of the substrate, an insulating layer disposed on the first surface of the substrate, at least one gate electrode disposed on the insulating layer, and at least one injector zone of the second conductivity type being embedded in the first surface of the substrate defining a pn-junction between the injector zone and the drain zone being disposed under the at least one gate electrode, and a second MIS-FET having a gate electrode and having a source and drain electrodes defining a source-drain path being connected between the injector zone of the MIS-FET and the drain zone of the first MIS-FET, the gate electrode of the second MIS-FET being electrically connected to the at least one gate electrode of the first MIS-FET.

11 Claims, 5 Drawing Figures

MIS-FIELD EFFECT TRANSISTOR WITH CHARGE CARRIER INJECTION

The invention relates to an MIS-field effect transistor including a semiconductor substrate of a first conduction or conductivity type, at least one channel zone of the opposite conduction type embedded in a first surface of the substrate, a source zone of the first conduction type embedded in the channel zone, a drain zone adjoining the first surface, a drain electrode connected to a second surface, at least one gate electrode placed on an insulating layer applied to the first surface, and an injector zone of the opposite conduction type embedded in the first surface with a pn-junction which is located under the gate electrode.

Such a field effect transistor (FET) has already been described in Application Ser. No. 340,749 filed Jan. 19, 1982. MIS-FETs have a forward resistance $R_{on}$ which steeply increases with increasing maximum inverse voltage, and leads to the consequence that the resistance $R_{on}$ is larger for maximum inverse voltages above about 300 V than in bipolar transistors constructed for the same inverse voltage, if no special measures are taken. Charge carriers are now emitted into the drain zone through the injector zone, which causes an increased concentration of charge carrier pairs in the currentcarrying region. This is equivalent to an increase of the doping and thereby a reduction of the resistance $R_{on}$. In the MIS-FET described, the injector zone is connected to the gate electrode of the MIS-FET. Since the injector zone draws a certain amount of current, the control equipment, such as a VLSI circuit or a micro processor, is loaded powerwise. This, however, is undesirable for many purposes.

It is accordingly an object of the invention to provide an MIS-FET with charge carrier injection, which overcomes the hereinaforementioned disadvantages of the heretofore-known devices of this general type, and does so in such a way that a power-wise load on the control unit is largely avoided.

With the foregoing and other objects in view there is provided, in accordance with the invention, an MIS-FET assembly, comprising a first MIS-FET having a semiconductor substrate of a first conductivity or conduction type with first and second surfaces, at least one channel zone of a second conductivity type opposite the first conductivity type being embedded in the first surface of the substrate, a source zone of the first conductivity type being embedded in the channel zone, a drain zone adjoining the first surface of the substrate, a drain electrode connected to the second surface of the substrate, an insulating layer disposed on the first surface of the substrate, at least one gate electrode disposed on the insulating layer, and at least one injector zone of the second conductivity type being embedded in the first surface of the substrate defining a pn-junction between the injector zone and the drain zone being disposed under the at least one gate electrode, and a second MIS-FET having a gate electrode and having source and drain electrodes defining a source-drain path being connected between the injector zone of the first MIS-FET and the drain zone of the first MIS-FET, the gate electrode of the second MIS-FET being electrically connected to the at least one gate electrode of the first MIS-FET.

In accordance with another feature of the invention, the second MIS-FET includes a channel zone of the second conductivity type being embedded in the first surface of the substrate, a source zone of the first conductivity type being embedded in the channel zone, and a source contact forming a shunt between the source zone of the second MIS-FET and the channel zone of the second MIS-FET, the gate electrode of the second MIS-FET being disposed at a distance laterally from the at least one gate electrode of the first MIS-FET and at a distance laterally from the injector zone, and the source contact of the second MIS-FET being electrically connected to the injector zone.

In accordance with a further feature of the invention, the second MIS-FET includes a channel zone of the second conductivity type being embedded in the first surface of the substrate, a source zone of the first conductivity type being embedded in the channel zone, and a source contact forming a shunt between the source zone of the second MIS-FET and the channel zone of the second MIS-FET, the gate electrodes of the first MIS-FET and the second MIS-FET forming a common gate electrode and forming an accumulation layer under the common gate electrode between the channel zones of the first MIS-FET and the second MIS-FET, the injector zone being disposed between the first MIS-FET and the second MIS-FET and its width being dimensioned so as to completely interrupt the accumulation layer, and the source zone of the second MIS-FET being electrically connected to the injector zone.

In accordance with an added feature of the invention there is provided at least one auxiliary zone of the same conductivity type as the channel zone of the second MIS-FET, being embedded in the first surface of the substrate and being connected between the channel zone of the second MIS-FET and the injector zone for connecting the source zone of the second MIS-FET to the injector zone.

In accordance with another feature of the invention, the auxiliary zone is doped at least as heavily as the injector zone and the channel zones.

In accordance with a further feature of the invention, the substrate is part of a semiconductor chip including at least one additional first MIS-FET cell and at least one additional second MIS-FET cell, the auxiliary zones of each of the first MIS-FET cells and second MIS-FET cells being in the form of mutually connected runs.

In accordance with again another feature of the invention, the second MIS-FET cells are disposed at the periphery or edge of the semiconductor chip and the runs form a regular network.

In accordance with a concomitant feature of the invention, there is provided a first MIS-FET having a gate electrode, an injector zone and a drain zone, the improvement comprising a second MIS-FET, the second MIS-FET having source and drain electrodes defining a source-drain path connected between the injector zone of the first MIS-FET and the drain zone of the first MIS-FET, and the second MIS-FET having a gate electrode being electrically connected to the gate electrode of the first MIS-FET.

Other features which are considered as characteristic for the invention are set forth in the appended claims.

Although the invention is illustrated and described herein as embodied in an MIS-field effect transistor with charge carrier injection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
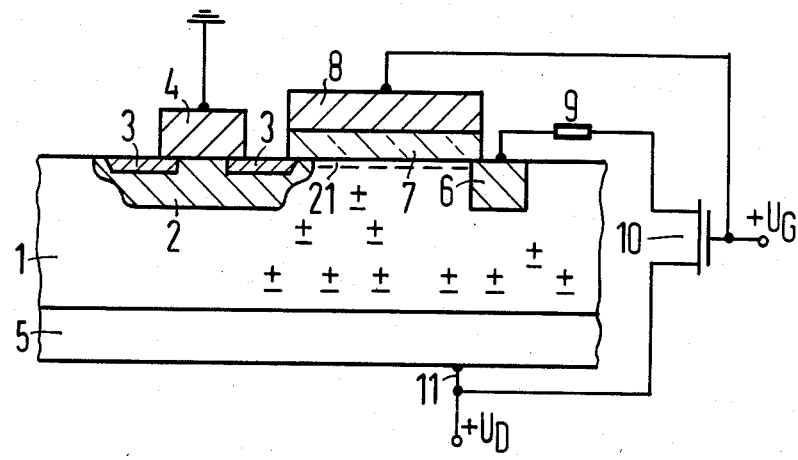
FIG. 1 is a fragmentary, diagrammatic, cross-sectional view, partly broken away, of a first embodiment of an MIS-FET with the corresponding circuit in accordance with the invention.

Referring now to the figures of the drawing and first particularly to FIG. 1 thereof, there is a first zone 1, which may be n-doped, into which a channel zone 2 of the opposite conduction or conductivity type is embedded. A source zone 3 of the first conduction type is embedded into the channel. The channel zone 2 and the source zone 3 are connected to each other electrically by a source contact 4. The zone 1 is relatively weakly doped as compared to the other zones 2 and 3; it is the substrate for the above-mentioned zones. The first zone 1, or at least a part thereof adjoining the upper surface, serves as the drain zone and is connected to a drain contact 11 by a heavily n-doped intermediate zone 5.

An injector zone 6 is also disposed in the surface into which the channel zone 2 is embedded. Placed onto this surface is a gate electrode 8 which is insulated from the surface by an insulating layer 7. The gate electrode 8 extends on the other side of the injector zone 6, at least to the part of the pn-junction emerging to the surface between the injector zone 6 and the drain zone 1, or the gate electrode overlaps the injector zone 6. On the other side thereof, the gate electrode 8 overlaps the part of the channel zone 2 which emerges to the surface of the semiconductor body and is not contacted by the source electrode 4. The injector zone 6 is connected, optionally through a resistor 9, to the source terminal of a further MIS-FET 10, the drain electrode of which is electrically connected to the drain terminal 11. The gate electrode of the further MIS-FET 10 is connected to the gate electrode 8.

If the voltage $+U_D$ is applied to the drain electrode 11, if ground potential is applied to the source electrode 4, and if both MIS-FETs are of the n-channel type, the MIS-FET and the further MIS-FET 10 are switched into conduction by a positive gate voltage $+U_G$. Under the gate electrode 8, an accumulation layer 21 of negative charge carriers is then formed. The concentration of charge carriers is so great in this case that the accumulation layer has at least approximately ohmic character. In this way, the potential in the environment of the injector zone 6 is lowered and the injector zone receives current from the drain electrode 11 through the further MIS-FET 10. The injector zone 6 therefore emits positive charge carriers into the drain zone 1. This again leads to an enrichment of negative charge carriers in this zone. Overall, the density of the charge carriers is thus increased, which is equivalent to a reduction of the forward resistance $R_{on}$.

Figure 2:
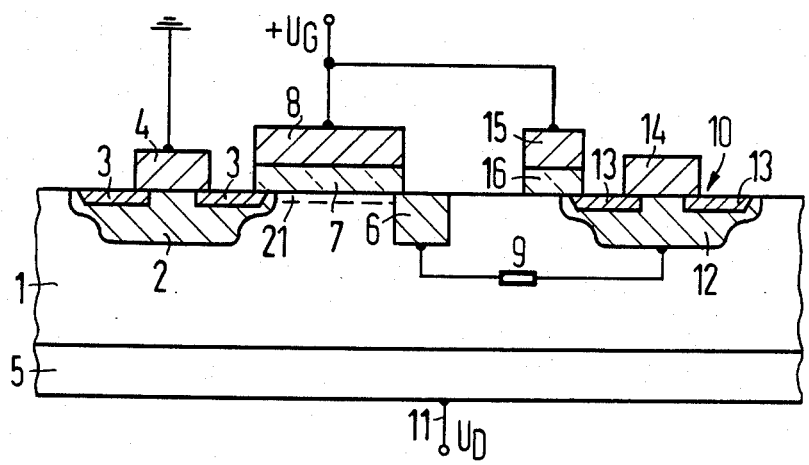
FIG. 2 is a similar cross-sectional view of an MIS-FET in accordance with a second embodiment of the invention.

Instead of the discrete MIS-FET 10 according to FIG. 1, the further MIS-FET can also be integrated into the semiconductor body of the first MIS-FET, as shown in FIG. 2. The further MIS-FET 10 has a channel zone 12 which is of the conduction type opposite that of the drain zone 1. A source zone 13 of the first conduction type is embedded into the channel zone. The source zone 13 and the channel zone 12 are connected to each other by a contact 14 which forms a shunt between these zones. The MIS-FET 10 is controlled by a gate electrode 15 which is disposed on an insulating layer 16. Both elements 15, 16 are disposed on a part of the channel zone 12 which emerges to the surface of the drain zone and is not contacted by the contact 14. The gate electrodes 15 and 8 are electrically connected to each other. The contact 14 is not electrically connected; it drifts to a potential which is predetermined by the electrical potential conditions in the semiconductor body. If both MIS-FETs are of the n-channel type (the zone sequence from the top being n+p+n−n+), both MIS-FETs are switched into conduction by a positive gate voltage $+U_G$. Under the gate electrode 8, an accumulation layer 21 is again formed which lowers the potential in the environment of the injector zone 6. A current therefore flows from the drain terminal 11 through the further MIS-FET 10 along a path through its source zone 13, the contact 14, the channel zone 12, and the optionally provided resistor 9 to the injector zone 6. The injector zone 6 then emits positive charge carriers which leads to the concentration increase of the charge carrier pairs in the drain zone 1 described in connection with FIG. 1.

The optionally provided resistor 9 may be an external resistor, it may be formed by a conductor run disposed on the surface or by an auxiliary zone integrated in the semiconductor body, having the same conduction type as the injector zone and the channel zone 12.

Figure 3:
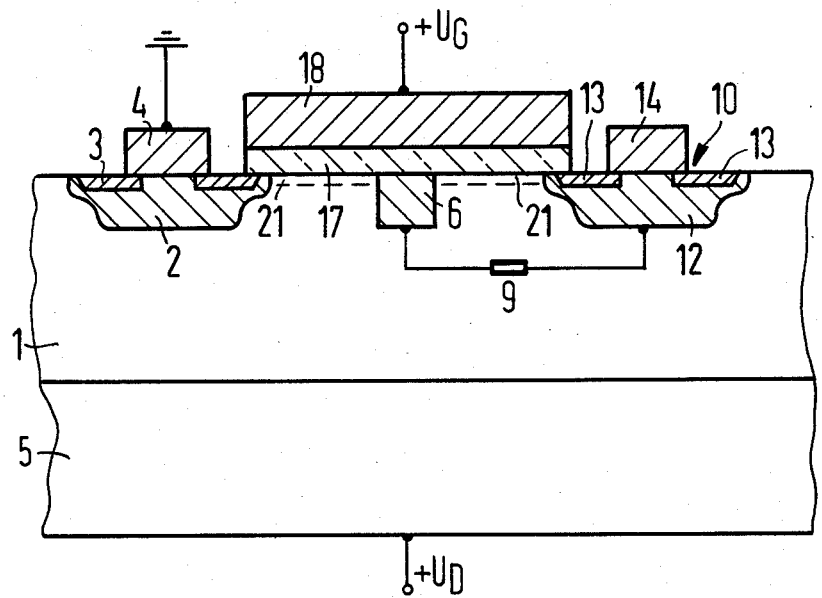
FIG. 3 is another similar cross-sectional view of an MIS-FET in accordance with a third embodiment of the invention.

The embodiment according to FIG. 3 differs from that according to FIG. 2 essentially by the fact that in FIG. 3 both MIS-FETs are controlled by a common gate electrode. The common gate electrode 18 is disposed on an insulating layer 17. The injector zone 6 is disposed between the two MIS-FETs, so that a parallel connection of the MIS-FETs is avoided. In this way, the accumulation layer 21 is interrupted so that no ohmic connection between the source zones 3 and 13 can come about.

Figure 4:
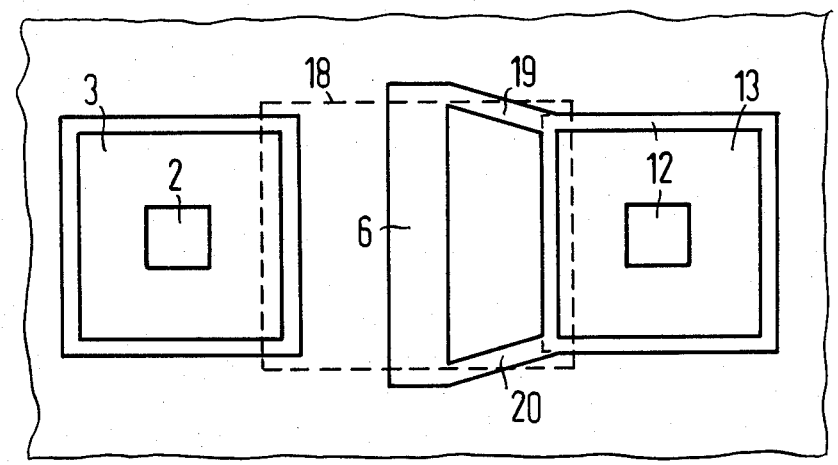
FIG. 4 is a fragmentary top plan view of the semiconductor body according to FIG. 3, in which all of the electrodes have been omitted for the sake of greater clarity.

As already mentioned in connection with FIG. 2, the resistance 9 or the electrical connection shown symbolically in FIG. 3, can be formed by one or more auxiliary zones of suitable doping which have the same conduction type as the injector zone and the channel zone. In FIG. 4, a possible embodiment is shown. There, the channel zone 12 is connected to the injector zone 6 by two runs 19, 20. The injector zone 6 is wider in this case than the gate electrode 18, the outlines of which are shown by dotted lines in the figure. In this way the accumulation or inversion layer 21 is completely interrupted and an ohmic connection between the two MIS-FETs is prevented.

Figure 5:
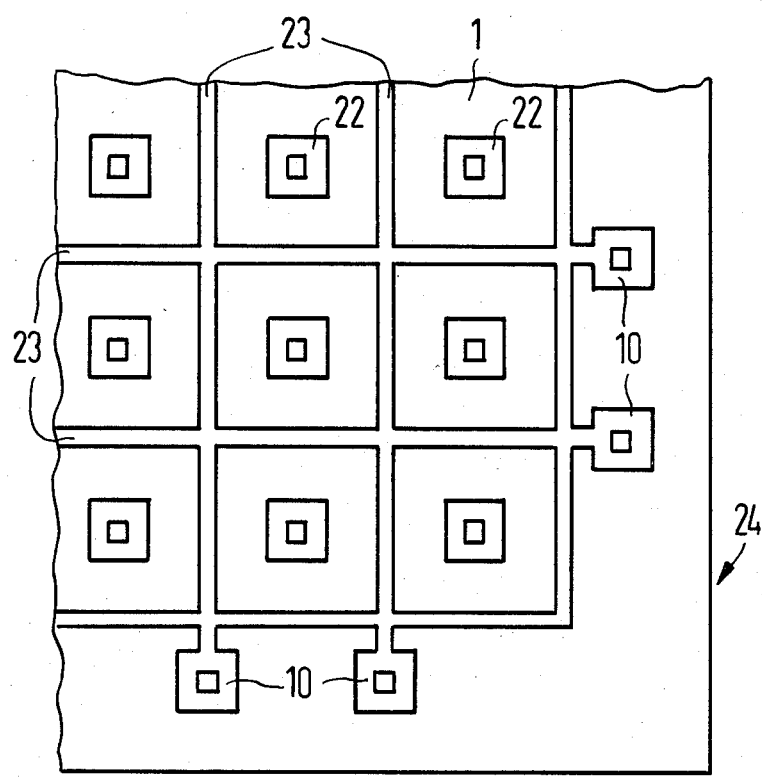
FIG. 5 is a fragmentary top plan view onto an MIS-FET with a multiplicity of cells.

The respective embodiments show details of large-area semiconductor bodies. For practical operation, a multiplicity of first MIS-FETs and further MIS-FETs are connected in parallel. An embodiment example of this construction is shown in FIG. 5. The source and gate electrodes have been omitted for the sake of better clarity. The further MIS-FETs 10 are located at the edge of a semiconductor chip 24 on which a multiplicity of first MIS-FET cells 22 are disposed. Runs 23 of the same conduction type are connected to the channel zones of the MIS-FET cells 10. The runs can form a regular network and they are always located between the cells 10, 22 for electrically separating the cells.

I claim:

1. MIS-FET assembly, comprising a first MIS-FET having a semiconductor substrate of a first conductivity type with first and second surface, at least one channel zone of a second conductivity type opposite said first conductivity type being embedded in said first surface of said substrate, a source zone of said first conductivity type being embedded in said channel zone, a drain zone adjoining said first surface of said substrate, a drain electrode connected to said second surface of said substrate, an insulting layer disposed on said first surface of said substrate, at least one gate electrode disposed on said insulating layer, and at least one injector zone of said second conductivity type being embedded in said first surface of said substrate defining a pn-junction between said injector zone and said drain zone being disposed under said at least one gate electrode, said gate electrode extending at least to the part of the pn-junction of said injector zone which emerges to the first substrate surface between the injector zone and the drain zone, and a second MIS-FET having a gate electrode and having a source and drain electrodes defining a source-drain path being connected between said injector zone of said first MIS-FET and said drain zone of said first MIS-FET, said gate electrode of said second MIS-FET being electrically connected to said at least one gate electrode of said first MIS-FET.

2. MIS-FET assembly, comprising a first MIS-FET having a semiconductor substrate of a first conductivity type with first and second surface, at least one channel zone of a second conductivity type opposite said first conductivity type being embedded in said first surface of said substrate, a source zone of said first conductivity type being embedded in said channel zone, a drain zone adjoining said first surface of said substrate, a drain electrode connected to said second surface of said substrate, an insulating layer disposed on said first surface of said substrate, at least one gate electrode disposed on said insulating layer, and at least one injector zone of said second conductivity type being embedded in said first surface of said substrate defining a pn-junction between said injector zone and said drain zone being disposed under said at least one gate electrode, said gate electrode extending at least to the part of the pn-junction of said injector zone which emerges to the first substrate surface between the injector zone and the drain zone, and a second MIS-FET having a gate electrode and having a source and drain electrodes defining a source-drain path being connected between said injector zone of said first MIS-FET and said drain zone of said first MIS-FET, said gate electrode of said second MIS-FET being electrically connected to said at least one gate electrode of said first MIS-FET; and wherein said second MIS-FET includes a channel zone of said second conductivity type being embedded in said first surface of said substrate, a source zone of said first conductivity type being embedded in said channel zone, and a source contact forming a shunt between said source zone of said second MIS-FET and said channel zone of said second MIS-FET, said gate electrode of said second MIS-FET being disposed at a distance laterally from said at least one gate electrode of said first MIS-FET and a distance laterally from said injector zone, and said source contact of said second MIS-FET being electrically connected to said injector zone.

3. MIS-FET assembly according to claim 2, including at least one auxiliary zone of the same conductivity type as said channel zone of said second MIS-FET being embedded in said first surface of said substrate and being connected between said channel zone of said second MIS-FET and said injector zone for connecting said source zone of said second MIS-FET to said injector zone.

4. MIS-FET assembly according to claim 3, wherein said substrate is part of a semiconductor chip including at least one additional first MIS-FET cell and at least one additional second MIS-FET cell, said auxiliary zones of each of said first MIS-FET cells and second MIS-FET cells being in the form of mutually connected runs.

5. MIS-FET assembly according to claim 4, wherein said second MIS-FET cells are disposed at the periphery of said semiconductor chip and said runs form a regular network.

6. MIS-FET assembly, comprising a first MIS-FET having a semiconductor substrate of a first conductivity type with first and second surfaces, at least one channel zone of a second conductivity type opposite said first conductivity type being embedded in said first surface of said substrate, a source zone of said first conductivity type being embedded in said channel zone, a drain zone adjoining said first surface of said substrate, a drain electrode connected to said second surface of said substrate, an insulating layer disposed on said first surface of said substrate, at least one gate electrode disposed on said insulating layer, and at least one injector zone of said second conductivity type being embedded in said first surface of said substrate defining a pn-junction between said injector zone and said drain zone being disposed under said at least one gate electrode, said gate electrode extending at least to the part of the pn-junction of said injector zone which emerges to the first substrate between the injector zone and the drain zone, and a second MIS-FET having a gate electrode and having a source and drain electrodes defining a source-drain path being connected between said injector zone of said first MIS-FET and said drain zone of said first MIS-FET, said gate electrode of said second MIS-FET being electrically connected to said at least one gate electrode of said first MIS-FET; and wherein said second MIS-FET includes a channel zone of said second conductivity type being embedded in said first surface of said substrate, a source zone of said first conductivity type being embedded in said channel zone, and a source contact forming a shunt between said source zone of said second MIS-FET and said channel zone of said second MIS-FET, said gate electrodes of said first MIS-FET and said second MIS-FET forming a common gate electrode and forming an accumulation layer under said common gate electrode between said channel zones of said first MIS-FET and said second MIS-FET, said injector zone being disposed between said first MIS-FET and said second MIS-FET and completely interrupting said accumulation layer, and said source zone of said second MIS-FET being electrically connected to said injector zone.

7. MIS-FET assembly according to claim 6, including at least one auxiliary zone of the same conductivity type or said channel zone of said second MIS-FET being embedded in said first surface of said substrate and being connected between said channel zone of said second MIS-FET and said injector zone for connecting said source zone of said second MIS-FET to said injector zone.

8. MIS-FET assembly according to claim 7, wherein said auxiliary zone is doped at least as heavily as said injector zone and said channel zones.

9. MIS-FET assembly according to claim 7, wherein said substrate is part of a semiconductor chip including at least one additional first MIS-FET cell and at least one additional second MIS-FET cell, said auxiliary zones of each of said first MIS-FET cells and second MIS-FET cells being in the form of mutually connected runs.

10. MIS-FET assembly according to claim 9, wherein said second MIS-FET cells are disposed at the periphery of said semiconductor chip and said runs form a regular network.

11. In a dual MIS-FET assembly including a first MIS-FET having a first gate electrode, an injector zone partially overlapped by the first gate electrode and a first drain zone and a first source zone, the improvement comprising a second MIS-FET, said second MIS-FET having a second source and a second drain electrode defining a source-drain path connected between the injector zone of the first MIS-FET and the drain zone of the first MIS-FET, and said second MIS-FET having a gate electrode being electrically connected to the gate electrode of the first MIS-FET.

* * * * *